(12) United States Patent  (10) Patent No.: US 7,945,407 B2
Kenichi et al.  (45) Date of Patent: May 17, 2011

(54) SIGNAL ANALYZERS AND FREQUENCY DOMAIN DATA PRODUCTION METHODS (75) Inventors: Miyake Kenichi, Saitama (JP);
Hiroyuki Yamagaki, Saitama (JP);
Kuniharu Hori, Tokyo (JP)

(73) Assignee: Tektronix, Inc, Beaverton, OR (US)

( * ) Notice: Subject to any disclaimer, the term of this patent is extended or adjusted under 35 U.S.C. 154(b) by 280 days.

(21) Appl. No.: 11/858,088

(22) Filed: Sep. 19, 2007

(65) Prior Publication Data

US 2008/0144856 A1 Jun. 19, 2008

(30) Foreign Application Priority Data

Sep. 19, 2006 (JP) .................................. 2006-253262

(51) Int. Cl.
*G01R 23/00* (2006.01)
(52) U.S. Cl. ................ 702/75; 702/57; 702/69; 702/76; 600/544; 324/76.13; 324/76.19; 324/76.78; 324/76.24; 370/343; 370/481; 370/484; 455/226.1; 455/67.11; 375/340; 375/316
(58) Field of Classification Search .................... 702/57, 702/69, 72, 75, 79, 77, 76; 600/544; 324/76.13, 324/76.19, 76.23, 76.78, 76.29, 76.55, 76.82, 324/76.24; 370/343, 481, 484, 497; 455/226.1, 455/67.11; 375/340, 316
See application file for complete search history.

(56) References Cited

U.S. PATENT DOCUMENTS

| 4,579,125 | A | * | 4/1986 | Strobl et al. | ................. | 600/544 |
| 4,843,309 | A |   | 6/1989 | Kareem |   |   |
| 5,659,546 | A | * | 8/1997 | Elder | ............. | 370/343 |
| 6,140,809 | A | * | 10/2000 | Doi | ............................. | 324/76.24 |
| 6,229,998 | B1 |   | 5/2001 | Hamdy et al. |   |   |
| 6,233,529 | B1 |   | 5/2001 | Nonaka |   |   |

(Continued)

FOREIGN PATENT DOCUMENTS

JP 2005055412 A 3/2005

(Continued)

OTHER PUBLICATIONS

U.S. Appl. No. 12/092,567 titled "Wide-Bandwidth Spectrum Analysis of Transient Signals Using a Real-Time Spectrum Analyzer" filed May 2, 2008 to Kyle L. Bernard.

(Continued)

*Primary Examiner* — Carol S Tsai
(74) *Attorney, Agent, or Firm* — Michael A. Nelson (57) ABSTRACT

Sets of time domain data of respective frequency bands from Fd-1 to Fd-n of a periodic input signal Fs are acquired. Sets of the time domain data of the common frequency band are extracted from the sets of the time domain data of the frequency bands Fd-1 and Fd-2 in the acquired frequency bands. Correlativity between the sets of the time domain data of the common frequency band is determined while shifting time relationship between the sets each other to identify the sets of time domain data having correspondence relationship. The sets of the time domain data having the correspondence relationship in the time domain data of the adjacent frequency band Fd-1 and Fd-2 are converted to the sets of the frequency domain data respectively, and the sets of the frequency domain data are combined to produce one set of combined frequency domain data.

1 Claim, 4 Drawing Sheets

U.S. PATENT DOCUMENTS

| | | | |
|---|---|---|---|
| 6,340,883 B1 * | 1/2002 | Nara et al. | 324/76.78 |
| 6,512,788 B1 | 1/2003 | Kuhn et al. | |
| 6,714,605 B2 | 3/2004 | Sugar et al. | |
| 6,850,735 B2 | 2/2005 | Sugar et al. | |
| 7,257,497 B2 | 8/2007 | Pickerd | |
| 7,428,464 B2 * | 9/2008 | Nara | 702/75 |
| 2005/0002473 A1 | 1/2005 | Kloper et al. | |
| 2005/0021261 A1 * | 1/2005 | Nara | 702/75 |
| 2008/0258706 A1 | 10/2008 | Bernard | |

FOREIGN PATENT DOCUMENTS

JP    2005265535 A  *  9/2005

OTHER PUBLICATIONS

Non-Final Rejection in U.S. Appl. No. 12/092,567 dated Nov. 2, 2010.

Final Rejection in U.S. Appl. No. 12/092,567 dated Jan. 26, 2011.

* cited by examiner

SIGNAL ANALYZERS AND FREQUENCY DOMAIN DATA PRODUCTION METHODS

BACKGROUND

Embodiments of the present invention relate to signal analyzers and frequency domain data production methods, and more particularly to signal analyzers and frequency domain data production methods for measuring a wide band input signal by acquiring time domain data of frequency bands of a periodic input signal and combining the frequency bands using correlations of common frequency bands between adjacent frequency bands.

Recently, the mainstream of the Internet, mobile phone, etc. is wide band communication with high volume and fast data communication. The transition to wide band communication requires that a signal analyzer for measuring signal quality of the data should have a wide band, also. As used herein, the signal analyzer is an apparatus that produces time and frequency domain data of a signal under test (SUT) and can analyze the signal under test from various viewpoints using the data.

US patent publication No. 2005/0021261 discloses a signal analyzer that has a plurality of frequency conversion paths to make wide band signal measurement possible as a technology to realize the wide band measurement. Specifically, the signal analyzer has first, second and third frequency conversion paths that acquire sets of time domain data of continuous different frequency bands. It increases the number of the data by interpolating the time domain data according to a bandwidth of a combined frequency band that is derived by combining the continuous different frequency bands, and then produces a set of frequency domain data with FFT calculation to be able to measure a wide band signal at a time.

The signal analyzer discussed above has the following issues.
(1) Because the above signal analyzer requires a plurality of frequency conversion paths to analyze a wide band signal, the signal analyzer becomes more expensive than the case to analyze a signal with a single frequency conversion path.
(2) Even if the plurality of frequency conversion paths is used for analyzing a wide band signal, there is a limit to be able to acquire a frequency bandwidth at a time because of limit of hardware process speed.

To deal with the above issues, a signal analyzer and frequency domain data production method that allow measuring wide band frequency domain data of a signal under test is needed.

SUMMARY

To solve the above problems, a signal analyzer according to an embodiment of the present invention has a data acquisition means receiving an input signal having periodicity for acquiring sets of the time domain data of respective frequency bands of the input signal at different time wherein the frequency bands have common frequency bands in the adjacent portions, and a calculation means for extracting sets of time domain data of the common frequency bands of the adjacent frequency bands in the acquired time domain data of the frequency bands, identifying the corresponding sets of the time domain data of the adjacent frequency bands using the extracted sets of the time domain data of the common frequency bands and converting the corresponding sets of the time domain data into respective sets of frequency domain data to combine them.

Wherein if the number of the corresponding sets of the time domain data of the adjacent frequency bands is less than a predetermined number, the data acquisition means may acquire one of or both the sets of the time domain data of the adjacent frequency bands again.

A frequency domain data production method according to an embodiment the present invention has a step of acquiring the sets of the time domain data of respective frequency bands of an input signal having periodicity wherein the frequency bands have common frequency bands in the adjacent portions, a step of extracting sets of time domain data of the common frequency bands of the adjacent frequency bands from the acquired time domain data of the frequency bands, a step of identifying the corresponding sets of the time domain data of the adjacent frequency bands using the extracted sets of the time domain data of the common frequency bands and a step of converting the corresponding sets of the time domain data into respective sets of frequency domain data to combine them.

According to embodiments the present invention, a bandwidth of an input signal is not limited by a sampling frequency of an analog to digital converter and it can produce wide band frequency domain data of the input signal. Embodiments of the present invention can measure the input signal with wide band without using a plurality of frequency conversion paths so that it leads to low cost compared to using the plurality of frequency conversion paths. Embodiments of the present invention can be also realized with a signal analyzer using a plurality of frequency conversion paths. In this case, a frequency bandwidth of the frequency domain data produced at a time is wider so that wide band frequency domain data would be produced faster.

The objects, advantages and other novel features of the present invention are apparent from the following detailed description when read in conjunction with the appended claims and attached drawing views.

DETAILED DESCRIPTION

Embodiments of the present invention are described below referring to figures.

Figure 1:
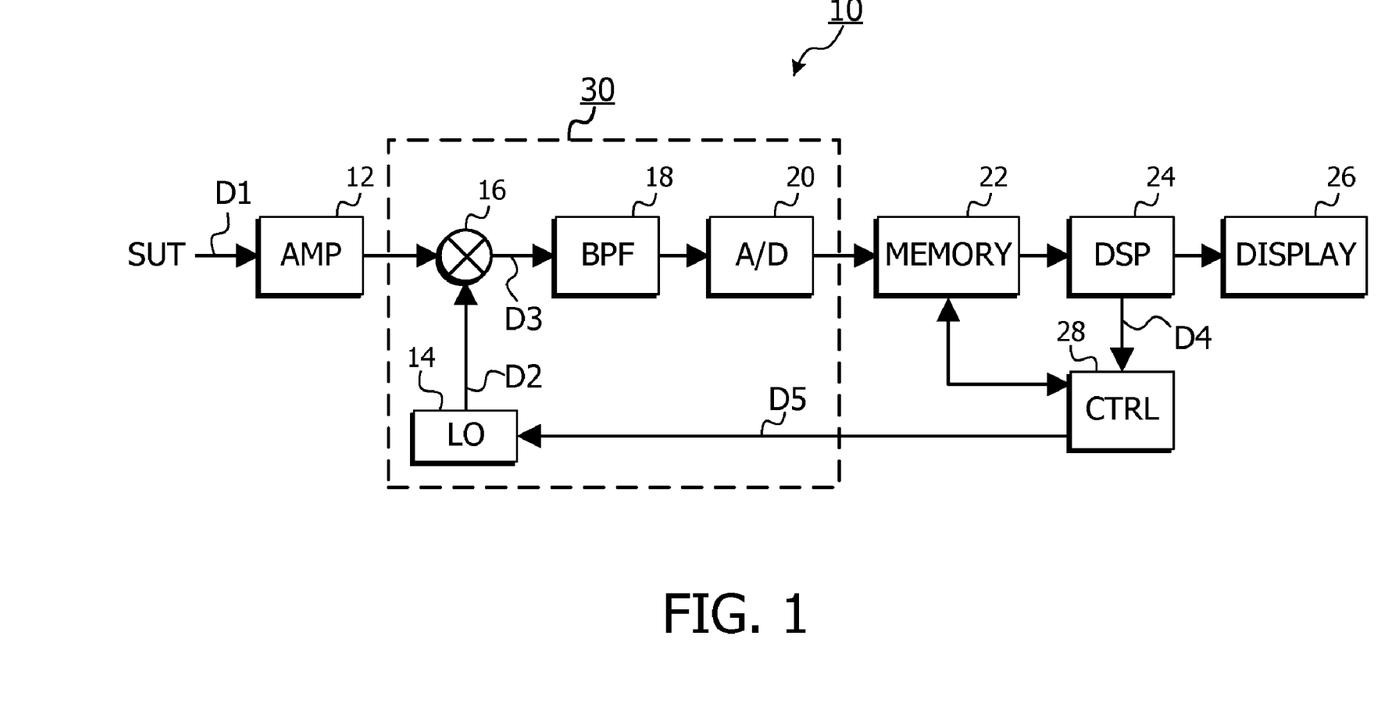
FIG. 1 is a block diagram of a signal analyzer of an embodiment according to the present invention

At first, configuration of a signal analyzer 10 for measuring a signal under test (SUT) D1 is described. FIG. 1 is a block diagram of the signal analyzer 10. The signal analyzer 10 according to an embodiment of the present invention receives a periodic signal under test and combines sets of frequency domain data derived from separately acquired sets of time domain data using the periodicity to produce a wide band combined frequency domain data.

As shown in FIG. 1, the signal analyzer 10 has amplifier 12, data acquisition block (data acquisition means) 30, memory 22, DSP (Digital Signal Processor, or calculation means) 24, display 26 and controller (control means) 28. The data acquisition block 30 has A/D converter 20 and analog down converter having local oscillator 14, mixer 16 and BPF (Band Pass Filter) 18.

The data acquisition block 30 produces sets of time domain data of the respective frequency bands (shown as from Fd-1 to Fd-6 in FIG. 2) of the signal under test. Note that adjacent portions of the frequency bands from Fd-1 to Fd-6 have overlapped common frequency bands as indicated Fc12 to Fc56 in FIG. 2.

The amplifier 12 amplifies the signal under test D1 (input signal) from an input terminal to provide it to the mixer 16.

The local oscillator 14 generates a local oscillation signal D2 for frequency-converting the signal under test D1 and provides it to the mixer 16. The local oscillator 14 changes a frequency of the local oscillation signal D2 according to a control signal D5 from the controller 28 described below.

The mixer 16 multiplies the input local oscillation signal D2 and signal under test D1 to produce an IF (intermediate frequency) signal D3 to provide it to the BPF 18.

The BPF 18 filters out frequency components of the frequency-converted IF signal D3 provided from the mixer 16 other than a predetermined band to provide it to A/D converter 20.

The A/D converter 20 converts the predetermined band of the IF signal D3 provided from the BPF 18 into time domain data.

Figure 2:
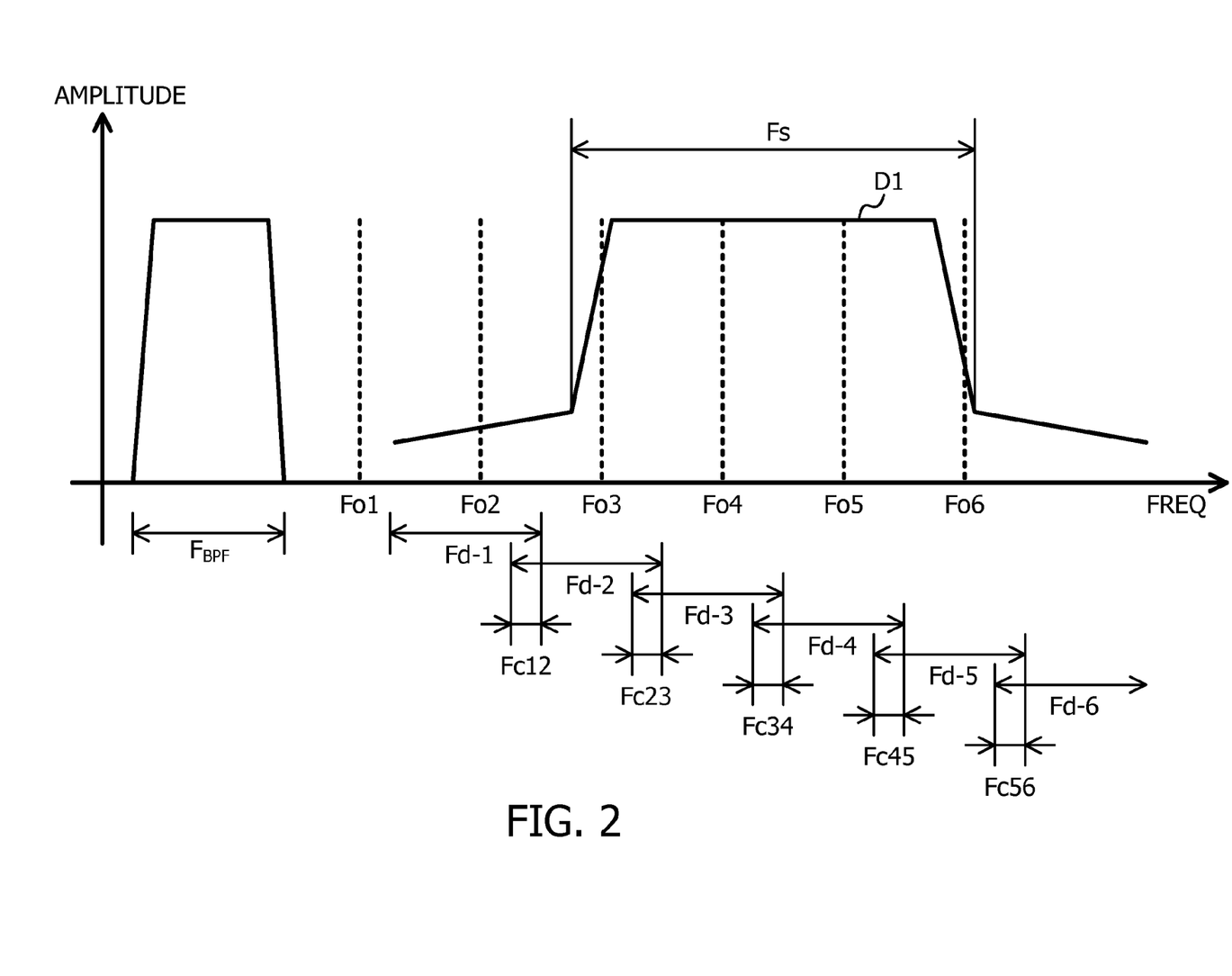
FIG. 2 is a graph showing a measurement principle of a signal under test

The memory 22 stores sets of time domain data of the respective frequency bands from Fd-1 to Fd-6 of the frequency-converted signal under test D1 by changing the frequency of the local oscillation signal D2 wherein the sets of the time domain data are stored with the respective frequency band identifiers n (n is a natural number). This allows recognizing that each of the sets of the time domain data stored in the memory 22 correspond to which frequency band of the signal under test D1 by referring to the frequency band identifiers n.

The DSP 24 extracts sets of time domain data of the respective common frequency bands of the adjacent frequency bands with digital filtering calculation. The digital filtering calculation realizes band pass filters of which pass bands are the common frequency bands. Then, correlativity between the sets of the time domain data of the extracted common frequency bands is determined. A user may set up a predetermined correlation coefficient (e.g. 0.9) and the correlativity may be determined using the set correlation coefficient as a benchmark. Wherein the DSP 24 calculates a correlation coefficient by shifting the sets of the time domain data of the common frequency band of two of the adjacent frequency bands relative to each other along a time axis. The sets of the time domain data are acquired at different times but if time relationship between them is being shifted, portions having the set correlation coefficient or more appear in the time domain data because the signal under test has periodicity and they have only frequency components of the common frequency band with the digital filtering calculation. The portions of the sets of the time domain data of adjacent frequency bands have a correlation indicated by the predetermined correlation coefficient or more are identified as sets of time domain data having correspondence relationship each other. In other words, the sets of the time domain data having the correspondence relationship are portions that have very similar waveforms when they are plotted along a time axis. If the number of the time domain data of portions having the predetermined correlation coefficient or more does not satisfy a number that the user sets up, the sets of the time domain data may be acquired again (described below).

If the correspondence relationships between the sets of the time domain data of the respective common frequency bands of the adjacent frequency bands are determined, it makes it possible to determine which data in one set of the time domain data of the two adjacent frequency bands including both the common frequency band and other frequency components corresponds to data in the other set of the time domain data. Then, the DSP 24 converts the corresponding sets of the time domain data of the two adjacent frequency bands to sets of frequency domain data with the FFT calculation and combines the sets of the frequency domain data of the adjacent frequency bands. When the sets of the frequency domain data of the adjacent frequency bands have combined, the DSP 24 provides a data acquisition signal D4 to the controller 28, and also provides the combined frequency domain data of the adjacent frequency bands to the display 26. The DSP 24 also works as a digital down converter so that it may frequency-convert the acquired time domain data with the digital calculation according to user settings, etc. in addition to the frequency conversion by the analog down converter.

The controller 28 reads out the frequency band identifier n from the memory 22 and increments it when the DSP 24 provides the data acquisition signal D4. Then, the controller 28 produces the control signal D5 corresponding to each frequency band based on the frequency band identifier n to provide it to the local oscillator 14. The memory 22 stores the incremented frequency band identifier n.

The display 26 produces an image signal based on the frequency domain data from the DSP 24 to for display operation based on the image signal to display the signal under test D1 as the frequency domain data on the screen.

Next, a principle of the frequency domain data production of the signal under test D1 is described. FIG. 2 describes the principle of the frequency domain data production of the signal under test D1. In FIG. 2, the horizontal axis of a graph is frequency and the vertical axis is amplitude.

In this embodiment, a frequency band, including a frequency band Fs that corresponds to the signal under test D1 occupies and some lower and higher bands, is sequentially acquired as the sets of the time domain data of the respective frequency bands from Fd-1 to Fd-6. The bandwidth of each frequency band may be the maximum bandwidth that the signal analyzer used for it can acquire at a time. Wherein the adjacent portions of the adjacent frequency bands have the overlapped common frequency bands Fc (from Fc12 to Fc56).

As described above, an embodiment of the present invention is applied to the signal under test D1 that has periodicity, or shows almost the same waveform periodically in the time domain. Therefore, the sets of the time domain data of the different frequency bands from Fd-1 to Fd-6 are acquired at different times (described below) in case of an embodiment of the present invention but when there are sets of data that have high correlation coefficients in the sets of the time domain data.

A frequency pass bandwidth $F_{BPF}$ of the BPF 18 may be set to the same as the bandwidth of each frequency band. When the sets of time domain data of the frequency bands from Fd-1 to Fd-6 are acquired, the controller 28 controls the local frequency of the local oscillation signal D2 from the local oscillator 14 as each of the frequency bands of outputs of the mixer 16 corresponding to the respective frequency bands Fd-1 to Fd-6 is within the frequency pass bandwidth $F_{BPF}$. FIG. 2 shows the local frequencies of the local oscillation signal D2 as Fon (n is a natural number) that is used when the set of the time domain data of the frequency band Fd-n (n is a natural number) is acquired. The memory 22 stores the set of time domain data corresponding to each frequency band while each set is related to the frequency band identifier n. The DSP 24 determines the correlativity between the sets of the time domain data of the common frequency bands Fc of the respective adjacent frequency bands, and identifies the sets of the time domain data having a predetermined value (e.g. a correlation coefficient is 0.9) or more correlativity as the sets of the data having correspondence relationship. The sets of the time domain data of the adjacent frequency bands including the common frequency bands Fc and other frequency components are converted to the sets of the frequency domain data that are combined to one set of the frequency domain data using the correspondence relationship. As described, the embodiment produces the wide band frequency domain data of the signal under test D1.

Figure 3:
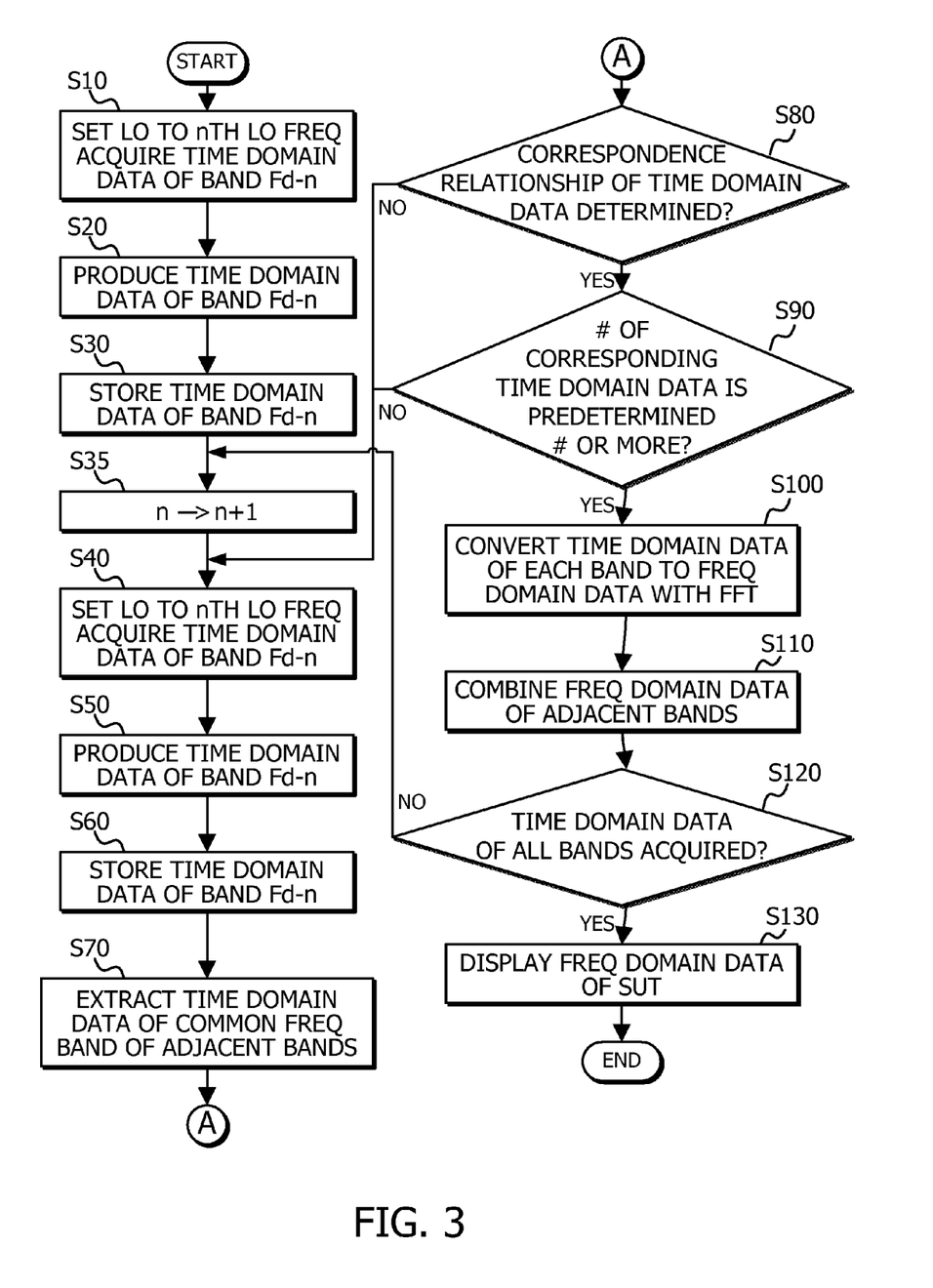
FIG. 3 is flowchart of showing operation of the signal analyzer
Figure 4:
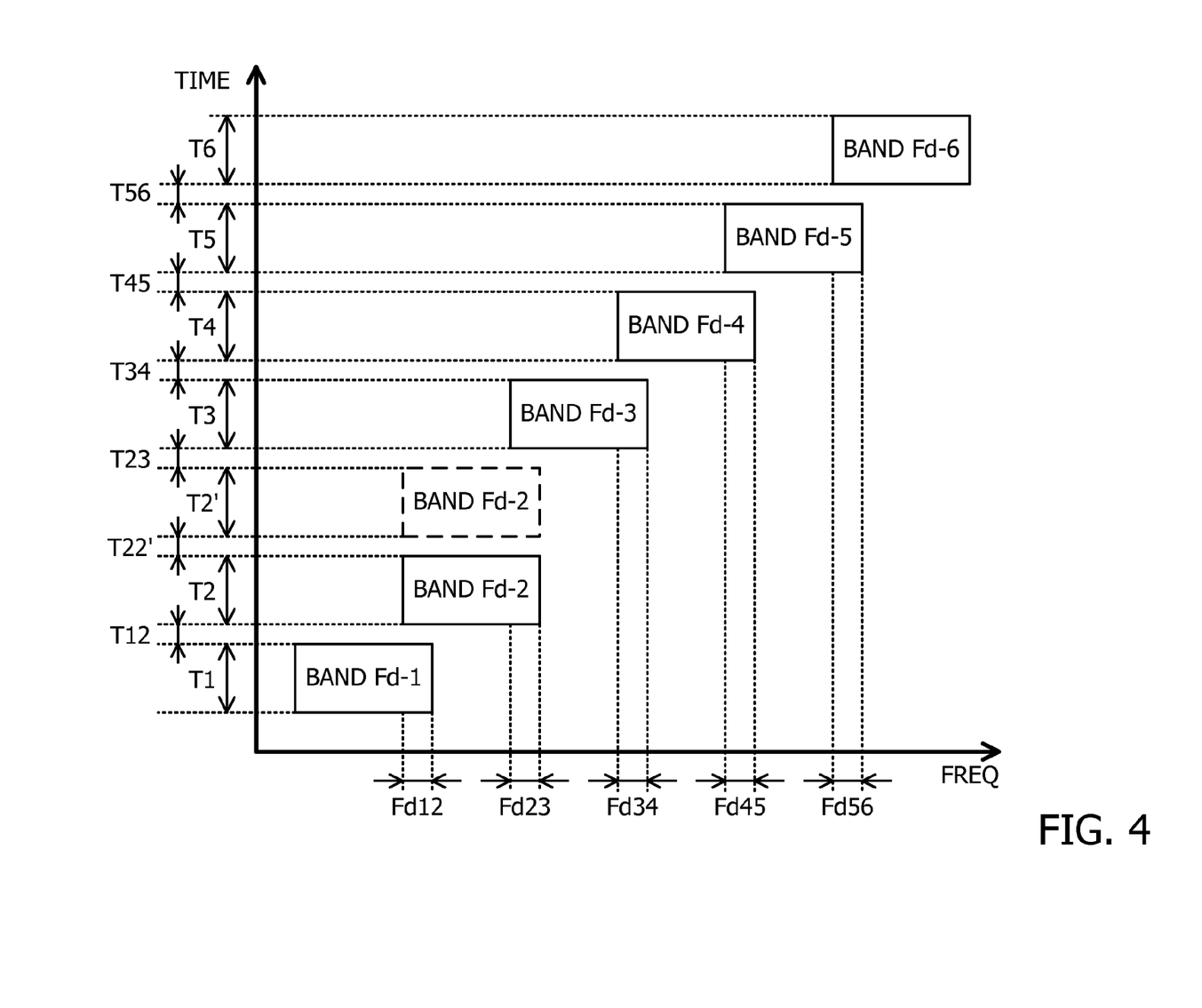
FIG. 4 is a graph of showing time domain data acquisition timing of different frequency bands

Operation of the signal analyzer 10 based on the above described measurement principle is described below referring to FIGS. 1 to 4. FIG. 3 is a flow chart showing the operation of the signal analyzer 10. FIG. 4 is a graph showing an example of acquisition timing of the time domain data of the respective frequency bands wherein the horizontal axis is frequency and the vertical axis is time.

At first, the frequency of the local oscillation signal D2 is set to an nth local frequency to acquire the time domain data of the frequency band Fd-n in a step S10 as shown in FIG. 3. In a specific example, when a measurement has started the controller 28 sets the frequency band identifier n in the memory 22 to "1" and produces the control signal D5 corresponding to the frequency band Fd-1 to provide it to the local oscillator 14. The local oscillator 14 changes the frequency of the local oscillation signal D2 to the first local frequency Fo1 (cf. FIG. 2) and provides the changed local oscillation signal D2 to the mixer 16. The mixer 16 produces the IF signal D3 by multiplying the signal under test D1 and the local oscillation signal D2 together and provides it to the BPF 18. The BPF 18 passes only a signal corresponding to the frequency band Fd-1 in the down-converted IF signal D3 and provides it to the A/D converter 20.

In a step S20, the A/D converter 20 converts the passed signal corresponding to the frequency band Fd-1 to the time domain data, or a digital signal. In a step 30, the memory 22 stores the time domain data of the frequency band Fd-1 converted to the digital signal while it is related to an area of the frequency band identifier "1". Thus the time domain data of the frequency band Fd-1 is acquired within a time T1 shown in FIG. 4.

In a step S35, the controller 28 increments the frequency band identifier n (n=1) in the memory 22 to update the frequency band identifier n to "2".

In a step S40, the frequency of the local oscillation signal D2 is set to the nth local frequency to acquire the time domain data of the frequency band Fd-n. In a specific example, when the DSP 24 provides the data acquisition signal D4 to the controller 28 (or the acquisition of the time domain data of the frequency band Fd-1 has finished), the controller 28 reads out the frequency band identifier "2" from the memory 22 and provides the control signal D5 for the frequency band Fd-2 corresponding to the frequency band identifier "2" to the local oscillator 14. The local oscillator 14 changes the frequency of the local oscillation signal D2 from the first local frequency Fo1 to the second local frequency Fo2 (cf. FIG. 2) and provides the changed local oscillation signal D2 to the mixer 16. The mixer 16 produces the IF signal D3 by multiplying the signal under test D1 and the local oscillation signal D2 together and provides it to the BPF 18. The BPF 18 passes only a signal corresponding to the frequency band Fd-2 in the down-converted IF signal D3 and provides it to the A/D converter 20.

In a step S50, the A/D converter 20 produces the time domain data of the frequency band Fd-n. In a specific example, the A/D converter 20 converts the signal that passes the BPF 18 and corresponds to the frequency band Fd-2 into the time domain data of the digital signal.

In a step S60, the memory 22 stores the time domain data of the frequency band Fd-2 while it is related to the frequency band identifier n. In a specific example, the memory 22 stores the time domain data of the frequency band Fd-2 converted to the digital signal while it is related to an area of the frequency band identifier "2". Thus the time domain data of the frequency band Fd-2 adjacent to the frequency band Fd-1 is acquired within a time T2 shown in FIG. 4.

In a step S70, sets of time domain data concerning a common frequency band Fc 12 are extracted from the respective sets of the time domain data of the adjacent frequency bands with the digital filtering calculation. The digital filtering calculation is a digital calculation that provides an equivalent result that a signal passes a band pass filter of which bandwidth is the same as the common frequency band Fc12.

In a step S80, the DSP 24 determines whether the correspondence relationship between the sets of time domain data of adjacent frequency bands is evaluated. In a specific example, if the filtering calculation provides the sets of time domain data of the common frequency band Fc12 of the frequency bands Fd-1 and Fd-2, the correlation coefficient between them is calculated while shifting the time relationship between them to identify sets of the time domain data between which correlation coefficient shows a predetermined value (e.g. 0.9) or more as the sets of the time domain data having a correspondence relationship. If the identified sets of the time domain data of the adjacent frequency bands are determined to have the correspondence relationship, it advances to a step 90.

On the other hand, if the filtering calculation does not provide the sets of the time domain data of the common frequency band Fc12, or there are only the sets of the time domain data between which correlation coefficient is less than 0.9, it determines there is no correlativity and returns to the step S40. In the step S40 of this case, to acquire time domain data showing high correlativity, a measurement time, a measurement period, etc. of the frequency band Fd-2 may be changed, the frequency band Fd-2 is measured again (a dotted box in FIG. 4) and the time domain data is acquired again within a time T2' (cf. FIG. 4).

In a step S90, the DSP 24 determines whether the data number of the time domain data that is determined to have the correspondence relationship (e.g. the correlation coefficient is 0.9 or more) between the sets of the time domain data of the respective frequency bands Fd-1 and Fd-2 is a predetermined number or more. If it determines the data number is the predetermined number or more, it advances to a step S100. On the other hand, if it determines the data number is less than the predetermined number, it returns to the step S40. In the step S40 of this case, to acquire the time domain data showing high correlativity, of which data number is the predetermined number or more, the measurement time, the measurement period, etc. of the frequency band Fd-2 is changed and the frequency band Fd-2 is measured again. Until the number of the data showing high correlativity becomes the predetermined number or more, the steps from S40 to S90 are repeated.

Note that there are some methods for reducing the remeasurement in the above steps 80 and 90 by improving the correlativity of the adjacent frequency bands as describe below, for example.

(1) To Change or Extend the Measurement Time of Each Frequency Band

This makes the number of the time domain data of the common frequency band Fc12 more, which leads to more time domain data showing a high correlation coefficient.

(2) To Adjust Timing of the Measurement Start to Align it with the Timing of the Period of the Signal Under Test For example, triggers are provided at repetitive start portions of the period of the signal under test D1 and the time domain data is acquired according to the triggers. A user previously sets a trigger condition that defines which portions are treated as the start portions. The trigger condition may be settings using the time domain data, frequency domain data or their combination.

In the step S100, using the correspondence relationship of the time domain data of the adjacent frequency bands with using the sets of the time domain data concerning the common frequency band, the DSP 24 converts the sets of the time domain data having the correspondence relationship in the time domain data of the adjacent frequency bands including the common frequency band and the other frequency components into the frequency domain data with the FFT calculation. Specifically, the DSP 24 converts the sets of the time domain data having the correspondence relationship each other in the time domain data of the frequency bands Fd-1 and Fd-2 to the sets of the frequency domain data respectively with the FFT calculation.

In a step S110, the sets of the frequency domain data of the adjacent frequency bands are combined. In a specific example, the DSP 24 combines the sets of the frequency domain data of the respective frequency bands Fd-1 and Fd-2 to produce one set of the combined frequency domain data. Note that two sets of the frequency domain data concerning the common frequency band Fc12 are produced; one is derived from the time domain data of the frequency band Fd-1 and the other is from the time domain data of the frequency band Fd-2. Then, one set of the frequency domain data may be used for producing the combined frequency domain data, or the upper and lower halves of the common frequency band may be produced by adopting the sets of the time domain data of the frequency bands Fd-1 and Fd-2, respectively. The other frequency bands are similar.

In a step S120, the DSP 24 determines whether the sets of the time domain data of all frequency bands (from Fd-1 to Fd-6) have been acquired based on the frequency band identifier n. If the sets of the time domain data of all frequency bands have been acquired (frequency band identifier n=6) it advances to a step 130. If the sets of the time domain data of all frequency bands have not been measured yet (frequency band identifier n is not 6), it advances to the step S35. In this embodiment, the frequency band identifier n is "2" in the memory 22 so far, it advances to the step S35.

The change of the local frequency of the local oscillator 14 in the steps S35 and S40 is conducted within a time T23 between times T2 and T3 shown in FIG. 4 as described below. The calculations of the correlation coefficient of the sets of the time domain data of the common frequency band of the adjacent frequency bands in the described steps from S70 to S120 and the FFT calculation are basically conducted in parallel to the data acquisition but may be done within the time T23.

In the step S35, the frequency band identifier n in the memory 22 is incremented and it advances to the step 40. In this embodiment, the frequency band identifier n is "2" so far, it is updated to "3".

In the step S40, the controller 28 provides the control signal D5 for the frequency band Fd-3 corresponding to the frequency band identifier "3" to the local oscillator 14. The local oscillator 14 changes the frequency of the local oscillation signal D2 from the second local frequency Fo2 to the third local frequency Fo3 and provides the changed local oscillation signal D2 to the mixer 16. The A/D converter 20 converts the signal that passes the BPF 18 and corresponds to the frequency band Fd-3 into the time domain data (step 50). The memory 22 stores the time domain data of the frequency band Fd-3 during the time T3 shown in FIG. 4 while it is related to an area of the frequency band identifier "3" (step 60). Then, the DSP 24 reads out the sets of the time domain data of the frequency bands Fd-2 and Fd-3 from the memory 22, extracts the sets of the common frequency band Fc23 of the frequency bands Fd-2 and Fd-3 (step 70) and determines the correlativity shifting the time relationship each other to identify the sets of the time domain data having the correspondence relationship (steps S80 and S90). If the number of the time domain data having the correspondence relationship is the predetermined number of more, the sets of the time domain data having the correspondence relationship in the sets of the time domain data of the respective adjacent frequency bands Fd-2 and Fd-3 are converted to the sets of the frequency domain data with the FFT calculation (step S100), and the sets of the frequency domain data of the respective frequency bands Fd-2 and Fd-3 are combined to the one set of the frequency domain data (step S110).

In this embodiment, such processes are repeated until the frequency band identifier n becomes "6", that is, until the frequency domain data of the frequency band Fd-6 is acquired. It combines the sets of the frequency domain data of the respective frequency bands from Fd-1 to Fd-6 into one set of frequency domain data to produce the combined frequency domain data including the frequency band Fs that the signal under test D1 occupies.

In the step S130, if the DSP 24 has finished combining the sets of the frequency domain data of all the frequency bands, it provides the combined frequency domain data to the display 26. The screen of the display 26 shows the one set of the combined frequency domain data of the signal under test D1 as shown in FIG. 2. Note that the display 26 may display it after completion of combing the all frequency bands of the signal under test D1 like this embodiment. But it may display it every time after combining the sets of the frequency domain data of the adjacent frequency bands.

This embodiment does not limit the bandwidth of the signal under test D1 with the sampling frequency of the A/D converter 20 and can produce wide band frequency domain data of the signal under test D1. This embodiment requires only one BPF 18 to down-convert the signals of the frequency bands (Fd-1 to Fd-6) to the frequency band $F_{BPF}$ of the BPF 18 to acquire the sets of the time domain data of the frequency bands, which makes the signal analyzer 10 compact and low cost. However, the present invention can be realized with the signal analyzer using a plurality of frequency conversion paths. That is, the sets of the time domain data of the respective frequency bands (Fd-1 to Fd-6) may be produced with a plurality of frequency conversion paths disclosed in the patent document 1. In this case, a frequency bandwidth of the frequency domain data produced at a time is wider so that wide band frequency domain data would be produced faster.

The scope of the present invention is not limited to the described embodiment, modifications and improvements may be made without departing from the scope of the invention. For example, the described embodiment shows an example of deriving the frequency domain data of the signal under test D1 from the time domain data acquired from the six frequency bands but it is not limited to this and the present invention can be realized using two or more frequency bands. The frequency bands have the same bandwidth in the embodiment but the frequency bands may have different bandwidths, respectively. In this case, a frequency band of the BPF 18 may be changed depending on each frequency band.

What is claimed is:

1. A signal analyzer comprising:

data acquisition means receiving an input signal having periodicity for acquiring sets of time domain data of respective frequency bands of the input signal wherein the frequency bands have common frequency bands in adjacent portions; and calculation means extracting sets of time domain data of the common frequency bands of the adjacent frequency bands in the acquired time domain data of the frequency bands, identifying the corresponding sets of the time domain data of the adjacent frequency bands using the extracted sets of the time domain data of the common frequency bands and converting the corresponding sets of the time domain data into respective sets of frequency domain data to combine them;

wherein if the number of the corresponding sets of the time domain data of the adjacent frequency bands is less than a predetermined number, the data acquisition means acquires one of or both the sets of the time domain data of the adjacent frequency bands again.

* * * * *